United States Patent
Van Hoof et al.

(10) Patent No.: US 11,307,507 B2
(45) Date of Patent: Apr. 19, 2022

(54) METHOD TO OBTAIN A HEIGHT MAP OF A SUBSTRATE HAVING ALIGNMENT MARKS, SUBSTRATE ALIGNMENT MEASURING APPARATUS AND LITHOGRAPHIC APPARATUS

(71) Applicant: ASML Netherlands B.V., Veldhoven (NL)

(72) Inventors: Bram Van Hoof, Wintelre (NL); Arjan Hölscher, Houten (NL); Alex Pascal Ten Brink, Utrecht (NL); Petrus Franciscus Van Gils, Rijen (NL)

(73) Assignee: ASML Netherlands B.V., Veldhoven (NL)

( * ) Notice: Subject to any disclaimer, the term of this patent is extended or adjusted under 35 U.S.C. 154(b) by 6 days.

(21) Appl. No.: 16/630,668

(22) PCT Filed: Jun. 5, 2018

(86) PCT No.: PCT/EP2018/064733
§ 371 (c)(1),
(2) Date: Jan. 13, 2020

(87) PCT Pub. No.: WO2019/011531
PCT Pub. Date: Jan. 17, 2019

(65) Prior Publication Data
US 2021/0116825 A1    Apr. 22, 2021

(30) Foreign Application Priority Data

Jul. 14, 2017  (EP) ..................................... 17181378
Nov. 29, 2017  (EP) ..................................... 17204344

(51) Int. Cl.
G03F 7/20    (2006.01)
G03F 9/00    (2006.01)

(52) U.S. Cl.
CPC ........ *G03F 9/7034* (2013.01); *G03F 7/70625* (2013.01); *G03F 7/70683* (2013.01)

(58) Field of Classification Search
CPC ............... G03F 9/7034; G03F 7/70683; G03F 7/70625; G03F 9/7026; G03F 7/70641;
(Continued)

(56) References Cited

U.S. PATENT DOCUMENTS 6,674,510 B1 * 1/2004 Jasper .................. G03F 9/7026
355/55
2005/0134816 A1   6/2005 Modderman et al.
(Continued)

FOREIGN PATENT DOCUMENTS

| CN | 1797213 A | 7/2006 |
|---|---|---|
| WO | WO 2015/131969 A1 | 9/2015 |
| WO | WO 2016/008647 A1 | 1/2016 |

OTHER PUBLICATIONS

International Search Report and Written Opinion of the International Searching Authority directed to related International Patent Application No. PCT/EP2018/064733, dated Oct. 24, 2018; 9 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

The present invention provides a method to obtain a height map of a substrate having alignment marks, the method comprising the steps: determining a height of one or more locations or areas of the substrate, and determining the height map of the substrate on the basis of the determined height of the one or more locations or areas of the substrate and a shape model of the substrate.

14 Claims, 4 Drawing Sheets

(58) Field of Classification Search
CPC .... G03F 9/7053; G03F 7/70633; G03F 7/705; G03F 7/70775; G03F 9/7003; G03F 9/7046; G03F 7/70141; G03F 7/70616; G03F 7/70508; G03F 7/70758; G03F 7/70525; G03F 7/70783; G03F 7/7065; G03F 7/7085; G03F 9/7049; G03F 9/7076; G03F 9/7019; G03F 7/70441; G03F 7/70341; G01B 11/0608

See application file for complete search history.

(56) References Cited

U.S. PATENT DOCUMENTS

| | | |
|---|---|---|
| 2008/0151204 A1 | 6/2008 | Van De Vin et al. |
| 2010/0045959 A1 | 2/2010 | Chou et al. |
| 2015/0042969 A1* | 2/2015 | Morikuni .............. G03F 9/7034 355/55 |
| 2017/0184980 A1 | 6/2017 | Bogaart |

OTHER PUBLICATIONS

International Preliminary Report on Patentability directed to related International Patent Application No. PCT/EP2018/064733, dated Jan. 14, 2020; 7 pages.

* cited by examiner

METHOD TO OBTAIN A HEIGHT MAP OF A SUBSTRATE HAVING ALIGNMENT MARKS, SUBSTRATE ALIGNMENT MEASURING APPARATUS AND LITHOGRAPHIC APPARATUS

CROSS-REFERENCE TO RELATED APPLICATIONS

This application claims priority of EP application no. 17181378.5, which was filed on 14 Jul. 2017 and EP application no. 17204344.0, which was filed on 29 Nov. 2017 and which are incorporated herein in its entirety by reference.

FIELD OF THE INVENTION

The present invention relates to a method to obtain a height map of a substrate having alignment marks, a substrate alignment measuring apparatus, and a lithographic apparatus.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In an embodiment of a lithographic apparatus, the position of the substrate, in particular the vertical position and/or height, is adapted for each target portion to improve the focus performance in the lithographic process. This positioning of the substrate is carried out on the basis of a height map of the substrate that is obtained by multiple scans of the substrate by a level sensor.

In a known embodiment of a lithographic apparatus a structure is used in which two stations are provided within the lithographic apparatus. During the processing of a substrate, the substrate is successively processed in the first station and the second station.

In the first station, the multiple scans of the substrate by the level sensor are performed. The multiple scans provide a height map representative for the height and/or height profile of the substrate. This height map may be any representation of the height and/or height profile of the upper surface of the substrate. Also, in the first station, alignment marks provided on the substrate are measured by an alignment sensor to determine a position of the substrate on the substrate support (which is generally a position in a plane of the substrate support).

In the second station, the actual lithographic process takes place. Due to the results of the measurements of the alignment marks in the first station, by the first alignment sensor, the alignment of the substrate with respect to a patterning device, and therewith the overlay performance of the lithographic apparatus, can be controlled. Furthermore, to improve the focus performance, the position, in particular the vertical and/or tilt position, of the substrate is adapted for each target position of the substrate on which a patterned radiation beam is projected.

This successive processing of the substrate in two successive stations has proven to provide very good results with respect to focus and overlay performance of the lithographic apparatus.

To optimize the production of the lithographic apparatus, the lithographic apparatus may comprise two substrate supports, such that the processing of substrates in the first station and the second station can be performed simultaneously.

A drawback of this known method is that the measurements of the height map of the substrate by the level sensor, which requires multiple scans of the complete substrate surface, may take a relatively long time. These time consuming scans may have a limiting effect on the production performance of the lithographic apparatus.

SUMMARY OF THE INVENTION

It is an object of the invention to provide a method to obtain a height map of a substrate that is less time consuming. It is a further object of the invention to provide methods and apparatus in which this method advantageously can be used.

According to a first aspect of the invention, there is provided a method to obtain a height map of a substrate having alignment marks, the method comprising the steps of:
  determining a height of one or more locations or areas of the substrate, and
  determining the height map of the substrate on the basis of the determined height of the one or more locations or areas of the substrate and a shape model of the substrate.

In an embodiment determining the height of the one or more locations or areas of the substrate comprises measuring positions of one or more alignment marks at different tilted and/or offset positions of the substrate; and determining a height of the one or more alignment marks on the basis of the measured positions of the one or more alignment marks. In a further embodiment, determining a height of the one or more alignment marks comprises determining differences in the measured positions of the one or more alignment marks between the different tilted and/or offset positions of the substrate, and calculating the height of the one or more alignment marks on the basis of the differences in the measured positions of the one or more alignment marks. In an embodiment calculating the height of the one or more alignment marks on the basis of the differences in the measured positions of the one or more alignment marks is based on a calibration between the differences in the measured positions of the one or more alignment marks and the height of the one or more alignment marks. In an embodiment the method further comprises the step of calibrating a relationship between the differences in the measured positions of the one or more alignment marks and the associated height of the one or more alignment marks.

In an embodiment the shape model of the substrate is determined on the basis of a single scan height map of the substrate by a level sensor and/or on the basis of a low resolution height map of the substrate.

In an embodiment the shape model of the substrate is determined on the basis of height measurements by a substrate stage position measurement system.

In an embodiment the shape model of the substrate comprises N variables and the one or more alignment marks are N or more alignment marks wherein N>1.

In an embodiment determining a height of one or more locations or areas of the substrate comprises measuring the height of one or more locations or areas of a part of the substrate with a level sensor. In an embodiment the shape model of the substrate comprises a higher order fit extrapolation of the measured height of the one or more areas of a part of the substrate. In a further embodiment, the shape model of the substrate comprises a higher order fit extrapolation of the measured height of the one or more areas of a part of the substrate in combination with an edge roll off profile and/or a mean intrafield pattern.

In an embodiment a method is provided to measure positions of multiple alignment marks on a substrate, comprising the steps of, in a first station, obtaining a height map of a substrate having alignment marks using the method according to the first aspect of the invention, and, in a second station comprising adapting a height and/or tilt position of the substrate on the basis of the height map. In an embodiment adapting the height and/or tilt position of the substrate on the basis of the height map is performed to improve a focus plane for measuring the position of the respective alignment mark. In an embodiment the method further comprises further comprising a step of determining positions of the multiple alignment marks in the second station and adapting the height and/or tilt position of the substrate for each alignment mark. In an embodiment the one or more alignment marks are X alignment marks, wherein the multiple alignment marks are Y alignment marks, and wherein Y>X.

In another embodiment, there is provided a method to project a patterned radiation beam on multiple target portions of a substrate, comprising the steps of, in a first station, obtaining a height map of a substrate having alignment marks according to the first aspect of the invention, and, in a second station, projecting successively a patterned radiation beam on multiple target portions of the substrate, comprising adapting, for each target portion, a height and/or tilt position of the substrate on the basis of the height map. In an embodiment adapting the height and/or tilt position of the substrate on the basis of the height map is performed to improve a focus plane of the patterned radiation beam on the respective target portion.

According to a second aspect of the invention, there is provided an alignment measuring apparatus to measure positions of multiple alignment marks on a substrate, comprising:
 a first station, comprising a first alignment sensor system to measure positions of one or more alignment marks at different tilted and/or offset positions of the substrate, and
 a processing unit to determine a height of the one or more alignment marks on the basis of the measured positions of the one or more alignment marks, and to determine the height map of the substrate on the basis of the determined height of the one or more alignment marks and a shape model of the substrate.

In an embodiment the alignment measurement apparatus further comprises a second station comprising a second alignment sensor system to measure positions of at least one of the multiple alignment marks. In an embodiment adapting the height and/or tilt position of the substrate on the basis of the height map is performed to improve a focus plane for measuring the position of the respective alignment mark by the second alignment sensor system.

According to a third aspect of the invention, there is provided a lithographic apparatus, comprising:
 a first station, comprising an alignment sensor system to measure positions of one or more alignment marks at different tilted and/or offset positions of the substrate,
 a processing unit to determine a height of the one or more alignment marks on the basis of the measured positions of the one or more alignment marks, and to determine the height map of the substrate on the basis of the determined height of the one or more alignment marks and a shape model of the substrate, and
 a second station, comprising a projection system to project successively a patterned radiation beam on multiple target portions of the substrate, wherein the lithographic apparatus is arranged to adapt, in the second station, for each target portion, a height and/or tilt position of the substrate on the basis of the height map provided by the processing unit.

According to a fourth aspect of the invention, there is provided a lithographic system, comprising:
 an alignment measuring apparatus according to the second aspect of the invention and
 a lithographic apparatus comprising a projection system to project successively a patterned radiation beam on multiple target portions of the substrate, wherein the lithographic apparatus is arranged to adapt, in a second station, for each target portion, a height and/or tilt position of the substrate on the basis of the height map provided by the processing unit.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
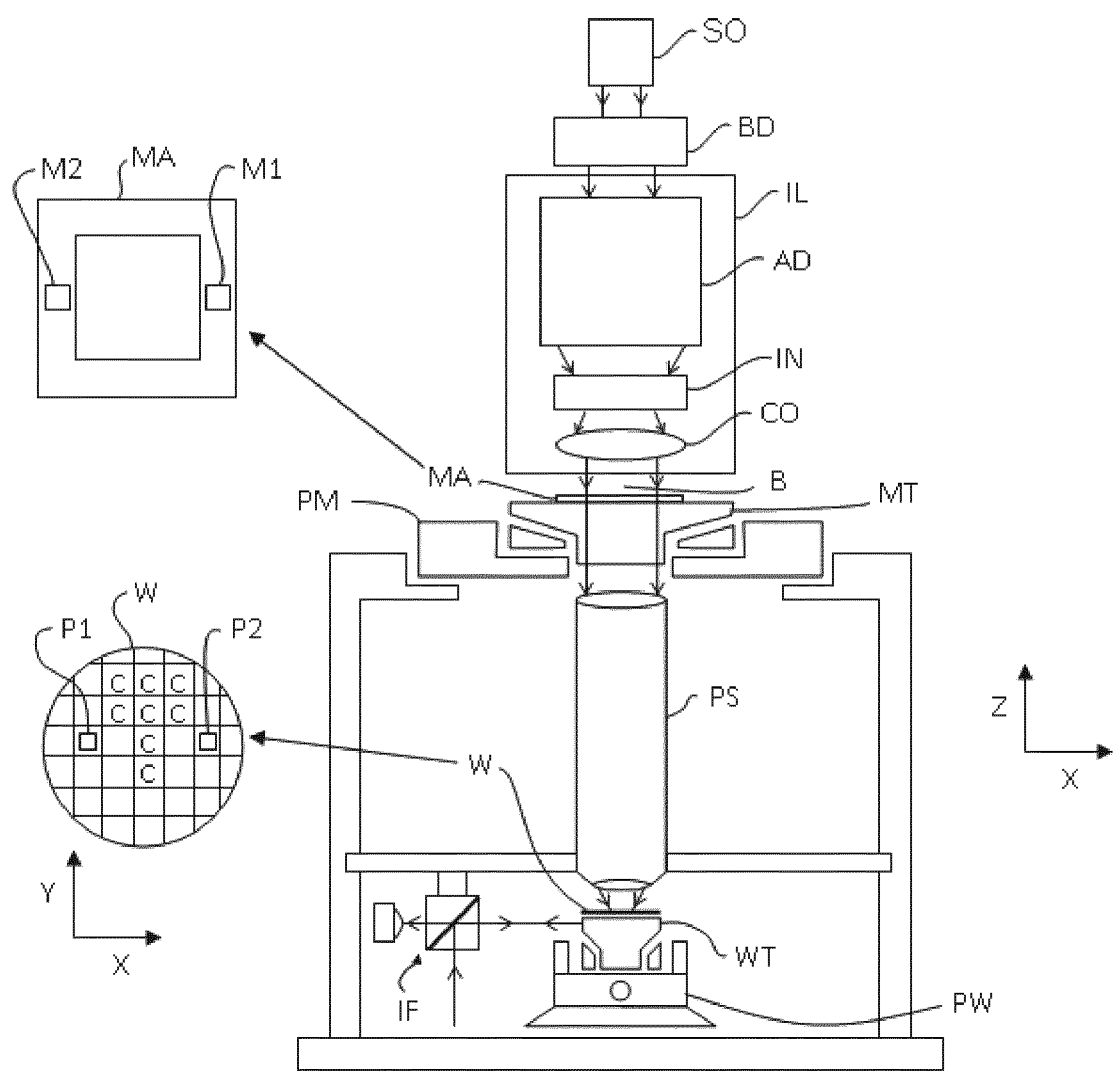
FIG. 1 depicts a lithographic apparatus in which embodiments of the invention may be provided.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resistcoated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having one or two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality. One or more additional tables may, additionally or alternatively, be part of an alignment or metrology apparatus separate from the lithography apparatus in which the tables are used to perform preparatory steps, such as alignment of the substrate and/or determining a height map of the substrate surface. Optionally, a transport or transfer system or apparatus may be configured to transfer substrates between the different tables.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
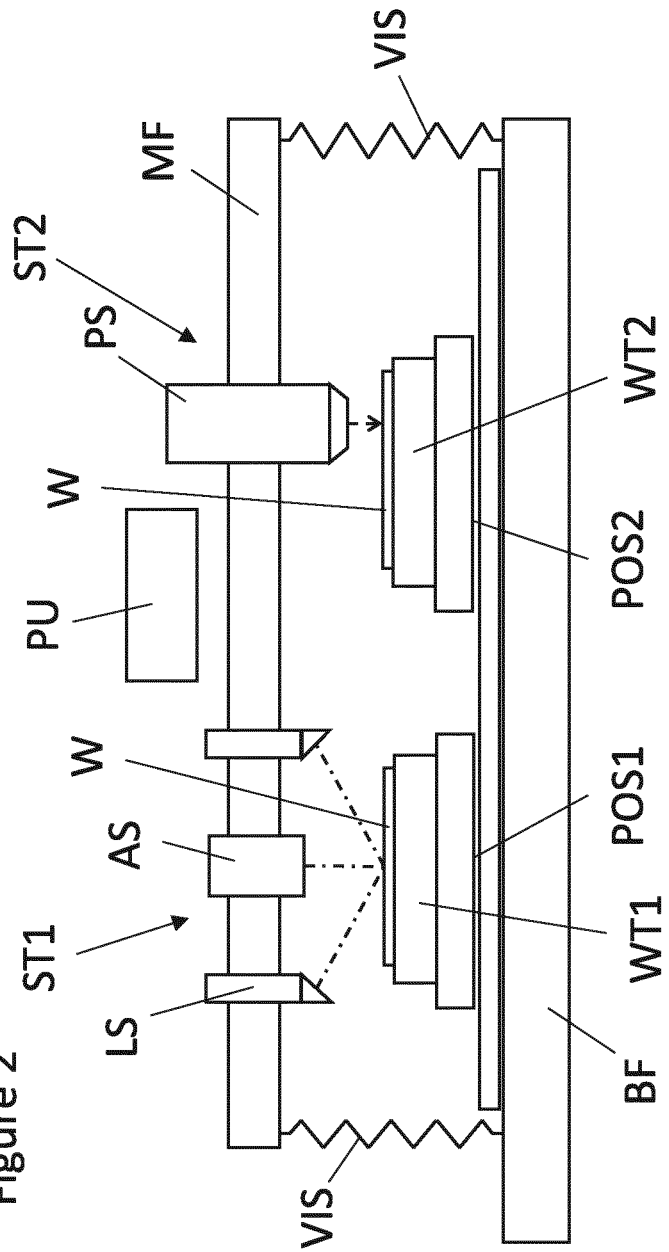
FIG. 2 shows schematically a lithographic apparatus according to an embodiment of the invention.

FIG. 2 shows a part of a lithographic apparatus having a first substrate table WT1 and a second substrate table WT2. The first substrate table WT1 and the second substrate table WT2 are each configured to support a substrate W during processing of the substrate W in the lithographic apparatus. A first positioning system POS1 is provided to position the first substrate table WT1 in a desired position, and a second position system POS2 is provided to position the second substrate table WT2 in a desired position. The first positioning system POS1 and the second positioning system POS2 are supported on a base frame BF.

The first positioning system POS1 and the second positioning system POS2, comprise an actuator system and a position measurement system to position the substrate W in six degrees of freedom.

The lithographic apparatus further comprises a metro frame MF which is supported on the base frame BF by vibration isolation supports VIS.

The lithographic apparatus comprises a first station ST1 and a second station ST2 for processing a substrate W. The first substrate table WT1 and the second substrate table WT2 are movable between the first station ST1 and the second station ST2, such that a substrate W supported on one of the first substrate table WT1 and the second substrate table WT2, can be successively processed in the first station ST1 and the second station ST2. Thus, there is no transfer of a substrate W between the first substrate table WT1 and the second substrate table WT2 required to process a substrate W in the first station ST1 and subsequently in the second station ST2.

Substrate handlers (not shown) may be provided to arrange a substrate W on the first substrate table WT1 and/or the second substrate table WT2, and/or to take a substrate W from the first substrate table WT1 and/or the second substrate table WT2.

In the first station, a level sensor LS and an alignment sensor AS are provided. The second station comprises a projection system PS to project a patterned radiation beam on target portions C of the substrate W supported on the second substrate table WT2. The lithographic apparatus may further comprise a radiation source, an illumination system and a patterning device (not shown in FIG. 2) to provide a patterned radiation beam to the projection system PS.

The level sensor LS is arranged to determine a height map of a substrate W arranged in the first station ST1. The height map of the substrate W, in particular a height map of the upper surface of the substrate W, is a map that provides for each location of the surface of the substrate the height of the substrate W. Since the main plane of the substrate W supported on a substrate table typically extends in a horizontal plane, the height map of the upper surface of the substrate W represents the vertical height of the upper surface of the substrate W for each location of the substrate W.

The level sensor LS uses a level sensor beam with visible or UV radiation. The determined height map of the substrate may be collected for the complete substrate W to provide a height map of the substrate W. The height map may be any dataset representing a two dimensional height profile of the surface of the complete substrate. To obtain a suitable height map with sufficient resolution to be used during projection of a patterned radiation beam on the target portions of the substrate, multiple scans of the level sensor over the complete surface of the substrate W are required. These multiple scans therefore need a relatively long time and may therefore limit the production performance of the lithographic apparatus.

The alignment sensor AS is provided and configured to measure alignment marks P1, P2 provided on the substrate W, as shown in FIG. 1. By measuring the positions of the alignment marks P1, P2, the substrate W can be properly aligned with the patterning device MA.

A processing unit PU is provided and configured to receive sensor signals of the level sensor LS and/or the alignment sensor to provide a height map and the positions of the alignment marks P1, P2 on the basis of these sensor signals. The processing unit PU may also be arranged to control the first positioning system POS1 and the second positioning system POS2.

The present method provides an alternative embodiment to determine a height map of the substrate W. Instead of using multiple scans of the surface of the substrate W by the level sensor LS, the lithographic apparatus is arranged to measure positions of one or more alignment marks P1, P2 at different tilted and/or offset positions of the substrate W.

The orientation of the substrate W may be tilted with respect to two perpendicular horizontal axes. In the different tilted positions the orientation of the substrate W with respect to at least one of the two horizontal perpendicular axes is different. An offset of the substrate W is a translation of the substrate W with respect to the respective alignment sensor AS, which is used to measure the positions of the alignment marks P1, P2 at the different orientations of the substrate W. The alignment marks may comprise any feature which is suitable for detecting its position by the alignment sensor AS, such as for example a periodic pattern located in a scribelane area in between product dies, a product feature, a DBO (Diffraction Based Overlay mark), etc.

Due to the change in the tilt and/or offset in the position of the substrate W there will be a shift in the measured positions of the alignment marks P1, P2. This shift due to change in tilt or offset in the position of the substrate W may be calibrated. As a result, the height of the substrate W at the alignment marks P1, P2, can be determined on the basis of the shift in the measured positions of the alignments marks P1, P2.

In other words, determining a height of the one or more alignment marks comprises determining differences in the measured positions of the one or more alignment marks between the different tilted and/or offset positions of the substrate, and calculating the height of the one or more alignment marks on the basis of the differences in the measured positions of the one or more alignment marks. The relationship between the differences in the measured positions of the one or more alignment marks and the associated height of the one or more alignment marks may be calibrated earlier. The calibrated relationship can then be used to calculate the height of the one or more alignment marks on the basis of the differences in the measured positions of the one or more alignment marks.

The determined height of the one or more alignment marks P1, P2 can be used in combination with a shape model of the substrate W to determine a height map of the complete substrate W. The shape model of the substrate W may for example be determined on the basis of a single scan height map of the substrate W obtained with the level sensor LS of the first station ST1.

The resulting height map of the substrate W, as provided by the processing unit PU, may be used in the second station ST2 to adapt a height and/or tilt position of the substrate W, with respect to the patterning device MA and/or the projection system PS to improve a focus plane of the patterned radiation beam on a respective target portion of the substrate W. In an embodiment a level or height sensor is arranged to measure a height of the substrate W in the second station ST2 of the target portions C before the patterned radiation beam is projected on these target portions C. The height as measured in the first station ST1 is combined with the height measurements of the level sensor in the second station ST2 to improve the accuracy of the height measurements and height map and thus to improve the focus setting during the projection of the patterned image on the target portions C.

It is remarked that the height map obtained by the determined height of the one or more alignment marks P1, P2 in combination with a height map obtained by a single scan of the level sensor LS, may result in a height map with lower accuracy than a height map obtained by multiple scans of the level sensor LS. However, the time needed to obtain this height map obtained by the determined height of the one or more alignment marks P1, P2 in combination with a height map obtained by a single scan of the level sensor LS is substantially smaller. Therefore, this method may be in particular suitable for lithographic processes in which the focus performance of the lithographic process is less important compared to overlay performance and productivity of the lithographic apparatus. In an embodiment, a relatively highly accurate height map is obtained of a first wafer of a batch or group of wafers, which will be subjected to the same patterned image, using a conventional substrate scanning method with the level sensor LS. For the subsequent wafers the relatively less accurate height map is obtained, for example the height map obtained by the determined height of the one or more alignment marks P1, P2 or using a single scan of the level sensor LS. This less accurate height map is combined with the more accurate height map of the first wafer to improve the less accurate height map of the subsequent wafers.

The shape model of the substrate W may also comprise a mathematical model of the surface of the substrate W and/or may be based on position measurements, including height measurements on the basis of position measurement system of the first positioning system POS1 or the second positioning system POS2.

The shape model of the substrate W may comprise N variables, and wherein the one or more alignment marks are N or more alignment marks and where N>1. The shape model of the substrate may be a higher order polynomial model, an edge local modal and/or a die by die model.

It will be clear that when the level sensor LS is not used to determine a height map of the substrate W, the level sensor LS may be omitted in the lithographic apparatus of FIG. 2 and the first station ST1 does not comprise a level sensor LS and, instead of the level sensor LS the alignment sensor AS is used to determine a height map of the substrate W.

In an embodiment (not shown) the first substrate table WT1 and the alignment sensor AS are provided in a, stand-alone, alignment apparatus instead of being integrated into a lithographic apparatus, for example the lithographic apparatus of FIG. 2. For example, a lithographic system or arrangement may be provided that comprises a metrology, for example an alignment, apparatus comprising for example the first substrate table WT1, the first positioning system POS1, the alignment sensor AS and optionally the level sensor LS. The lithographic system or arrangement further comprises a lithographic apparatus comprising, for example, the second substrate table WT2, the projection system PS and the second positioning system POS2. Optionally, the, stand-alone, lithographic apparatus may also comprise a level sensor. The processing unit PU may be provided in the dedicated, stand-alone, alignment apparatus, or in the lithographic apparatus or separate from both apparatus. An exchange or transport device may be provided which is configured to transport a substrate from the, stand-alone, alignment apparatus to the lithographic apparatus and/or vice versa.

Figure 3:
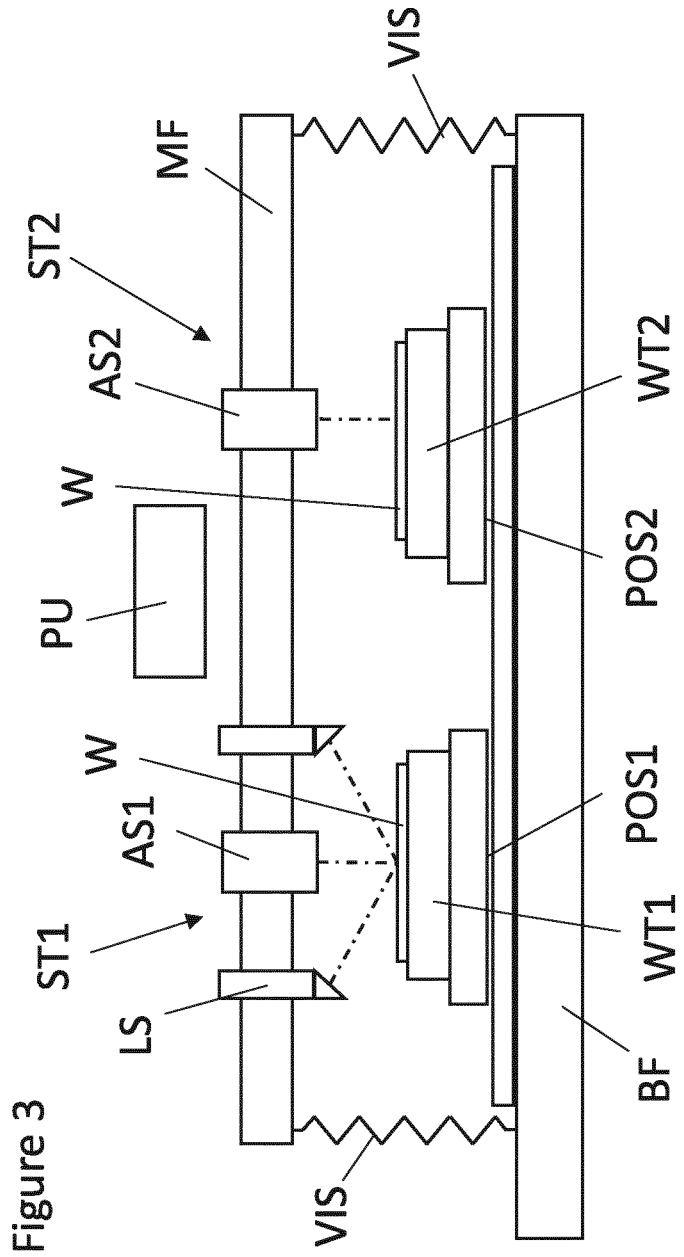
FIG. 3 shows schematically an alignment measuring apparatus according to an embodiment of the invention.

FIG. 3 shows an alternative apparatus for application of the above described method to determine a height map of the substrate W. The apparatus of FIG. 3 is a dedicated alignment measuring apparatus arranged to measure multiple alignment marks.

The apparatus of FIG. 3 generally comprises the same structure as the apparatus of FIG. 2. The apparatus comprises a first substrate table WT1 and a second substrate table WT2, each configured to support a substrate W. A first positioning system POS1 is provided to position the first substrate table WT1 in a desired position in six degrees of freedom, and a second position system POS2 is provided to position the second substrate table WT2 in a desired position in six degrees of freedom.

The apparatus comprises a first station ST1 and a second station ST2. The first substrate table WT1 and the second substrate table WT2 are movable between the first station ST1 and the second station ST2, such that a substrate W supported on one of the first substrate table WT1 and the second substrate table WT2, can be successively processed in the first station ST1 and the second station ST2.

Substrate handlers (not shown) may be provided to arrange a substrate W on the first substrate table WT1 and/or the second substrate table WT2, and/or to take a substrate from the first substrate table WT1 and/or the second substrate table WT2.

In the first station ST, a level sensor LS and a first alignment sensor AS1 are provided. The second station ST2 comprises a second alignment sensor AS2.

A processing unit PU is provided to receive sensor signals of the level sensor LS, the first alignment sensor AS1 and/or the second alignment sensor AS2 to process these sensor signals. The processing unit PU may also be arranged to control the first positioning system POS1 and the second positioning system POS2.

Similar to the lithographic apparatus of FIG. 2, the first alignment sensor AS1 is configured and used to measure positions of one or more alignment marks P1, P2 at different tilted and/or offset positions of the substrate W. On the basis of a calibrated relationship between a shift in the measured positions of the alignment marks at different tilted and/or offset positions of the substrate W and an associated height of the respective alignment marks, the height of the alignment marks may be determined.

In combination with a shape model of the substrate W, the determined height of the alignment marks can be used to determine a height map of the complete substrate W. The processing unit PU is arranged to determine this height map. The shape model may be any model representative of the shape of the substrate W. In particular, shape model may be based on a single scan of the substrate W using the level sensor LS, and/or a low resolution height map obtained with the level sensor LS.

The second alignment sensor AS2 in the second station ST2 is arranged to measure positions of multiple alignment marks. The number of multiple alignment marks may be substantially larger than the number of alignment marks measured in the first station ST1 by the first alignment sensor AS1. The multiple alignment marks may, for example, be more than 100 alignment marks. A suitable sampling scheme of alignment marks for which the position is to be measured on a substrate may be selected. For example the position of all alignment marks present on the substrate may be measured or all alignment marks located near an edge of the substrate in combination with a selection of alignment marks in a center area of the substrate. In an embodiment an optimized sampling scheme is selected comprising a selection of alignment marks for which the position is to be measured and which selection is based on alignment measurements of one or more previous wafers of a batch or group of wafers which are subject to the same patterning.

During measuring of the multiple alignment marks in the second station, the alignment measuring apparatus, in particular the first positioning system POS1 or the second positioning system POS2 arranged in the second station ST2 is configured to adapt a height and/or tilt position of the substrate W on the basis of the height map provided by the processing unit PU. The height and/or tilt position of the substrate W is adapted on the basis of the height map to improve a focus plane for measuring the position of the respective alignment mark by the second alignment sensor AS2. This improves the measuring performance of the alignment measurement of the second alignment sensor AS2.

In an embodiment the alignment apparatus comprises only the first station ST1, which comprises the alignment sensor AS1, which is configured to measure positions of one or more alignment marks P1, P2 at different tilted and/or offset positions of the substrate W, and the processing unit PU.

The resulting data obtained by measuring the multiple alignment marks may, for example, be fed to a lithography scanner for higher order substrate alignment modelling. The lithography scanner may comprise an alignment sensor which uses the alignment data obtained by the dedicated alignment measuring apparatus to improve the resulting accuracy of the alignment measurements of the alignment sensor of the lithography scanner and/or to reduce the amount of alignment marks that are measured by the alignment sensor of the lithography scanner.

It is remarked that the accuracy requirements for the height map in order to advantageously adapt the height and/or tilt position of the substrate W to improve a focus plane for measuring the position of the respective alignment mark by the second alignment sensor AS2, are relatively low. The height map obtained with the method of the invention may provide sufficient accuracy, i.e. 20-100 nm. This means that the accuracy of the height map that can be obtained using multiple scans of the level sensor LS, for example<20 nm is not required. Therefore, this time-consuming method of multiple scans with the level sensor LS can be replaced by the method according to the invention which allows to provide a height map of the substrate W with sufficient accuracy in considerable less time.

In an alternative embodiment of a method to obtain a height map of a substrate W, a height of one or more locations or areas of the substrate may be measured by measuring the height of one or more areas of a part of the substrate with the level sensor LS. The level sensor LS may in particular be used to carry out a limited number of level scans of the part of the substrate W.

Figure 4:
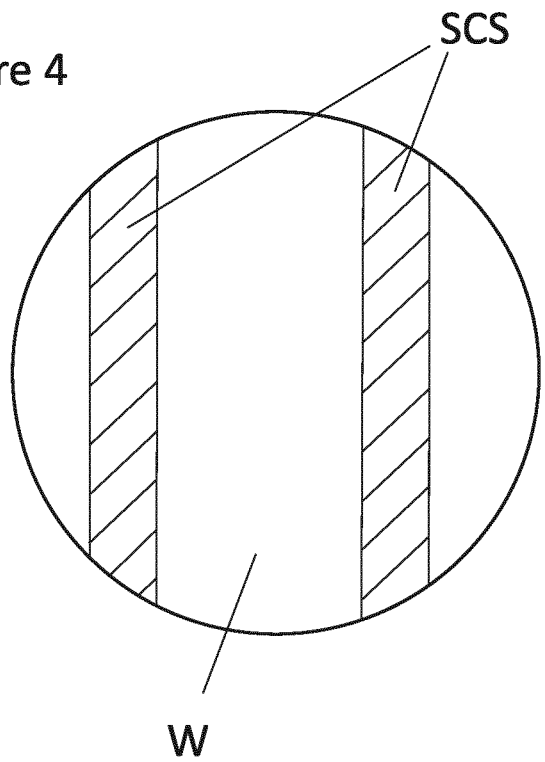
FIG. 4 shows a top view of two scan strokes of a level sensor on a substrate W.

FIG. 4 shows an example of a limited number of level scans of a part of the substrate W. In FIG. 4 a level sensor LS is used to scan two strokes SCS in parallel direction over the upper surface of the substrate W, but any other direction for these scan strokes may be envisioned and these scan strokes do not necessarily need to be parallel as long as at least a part of the substrate is scanned (measured) with a level sensor. Typically, the scan width of the lever sensor LS is smaller than the diameter of the substrate W. Thus, the two scan strokes SCS only cover a part of the substrate W. This measurement thus provides only a height map of the two scan strokes SCS. However, the measurement time of the two scan strokes SCS may take less than 20% of the time required to scan the complete surface of the substrate W with the level sensor LS.

On the basis of the height maps obtained by level measurements of the two scan strokes SCS and a shape model of the substrate W, a height map of the complete substrate W may be obtained. The shape model of the substrate W may for example comprise a higher order, for example $2^{nd}$ order or $4^{th}$ order, fit extrapolation of the measured height map of the two scan strokes SCS of the part of the substrate W. The shape model may further comprise an edge roll off profile, i.e. a typical shape of the substrate W at and/or near the edge of the substrate and/or a mean intrafield pattern, i.e. a typical shape of the substrate W in the main middle part of the substrate W.

It is remarked that any suitable number of scan strokes SCS in the same or different directions may be used. The number of scan strokes SCS, or more generally, the measured part of the substrate W should be sufficient to determine, in combination with the shape model, a height map of the complete substrate W with sufficient accuracy for the subsequent use of the height map. This accuracy may be smaller than the accuracy obtained with a full surface scan of the level sensor LS. But the time needed to determine the height map of the complete substrate W including the scanning of a part of the substrate with the level sensor may also be substantially smaller than the time required for a full surface scan of the level sensor LS.

The above method to obtain a height map of the complete substrate W can for example be used in the lithographic apparatus of FIG. 2, in particular when having a large focus budget, but tight overlay and/or productivity budgets, and/or in the apparatus of FIG. 3 having less stringent accuracy requirements to determine the focus plane for the alignment measurements in the second station. In these apparatuses the method may be an alternative for the method of measuring positions of one or more alignment marks at different tilted and/or offset positions of the substrate and determining a height of the one or more alignment marks on the basis of the measured positions of the one or more alignment marks, as described with respect to FIGS. 2 and 3.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method to obtain a height map of a substrate having alignment marks, the method comprising the steps of:
   determining a height of one or more locations or areas of the substrate; and
   determining the height map of the substrate based on the determined height of the one or more locations or areas of the substrate and a shape model of the substrate;
   wherein the shape model of the substrate is determined based on at least a single scan height map of the substrate by a level sensor, a low resolution height map of the substrate, and height measurements by a substrate stage position measurement system.

2. The method of claim 1, wherein determining the height of the one or more locations or areas of the substrate comprises:
   measuring positions of one or more alignment marks at different tilted and/or offset positions of the substrate; and
   determining a height of the one or more alignment marks on the basis of the measured positions of the one or more alignment marks.

3. The method of claim 2, wherein the determining a height of the one or more alignment marks comprises determining differences in the measured positions of the one or more alignment marks between the different tilted and/or offset positions of the substrate, and calculating the height of the one or more alignment marks on the basis of the differences in the measured positions of the one or more alignment marks.

4. The method of claim 3, wherein the calculating the height of the one or more alignment marks on the basis of the differences in the measured positions of the one or more alignment marks is based on a calibration between the differences in the measured positions of the one or more alignment marks and the height of the one or more alignment marks.

5. The method of claim 3, wherein the method further comprises the step of calibrating a relationship between the differences in the measured positions of the one or more alignment marks and the associated height of the one or more alignment marks.

6. The method of claim 1, wherein the determining the height map of the substrate using the shape model comprises using a shape model of the substrate comprising a higher order fit extrapolation of the measured height of the one or more areas of a part of the substrate, in combination with an edge roll off profile and/or a mean intrafield pattern.

7. A method to measure positions of multiple alignment marks on a substrate, comprising:
   in a first station, obtaining a height map of a substrate having alignment marks using the method of claim 1; and
   in a second station, adapting a height and/or tilt position of the substrate on the basis of the height map.

8. The method of claim 7, further comprising a step of determining positions of the multiple alignment marks in the second station and adapting the height and/or tilt position of the substrate for each alignment mark.

9. The method of claim 8, wherein the one or more alignment marks are X alignment marks, wherein the multiple alignment marks are Y alignment marks, and wherein Y>X.

10. A method to project a patterned radiation beam on multiple target portions of a substrate, comprising:
    in a first station, obtaining a height map of a substrate having alignment marks using the method of claim 1; and
    in a second station, projecting successively a patterned radiation beam on multiple target portions of the substrate, comprising adapting, for each target portion, a height and/or tilt position of the substrate on the basis of the height map.

11. An alignment measuring apparatus to measure positions of multiple alignment marks on a substrate, comprising:
    a first station, comprising a first alignment sensor system to measure positions of one or more alignment marks at different tilted and/or offset positions of the substrate; and
    a processing unit to determine a height of the one or more alignment marks on the basis of the measured positions of the one or more alignment marks, and to determine the height map of the substrate on the basis of the determined height of the one or more alignment marks and a shape model of the substrate;
    wherein the shape model of the substrate is determined on the basis of a single scan height map of the substrate by a level sensor and/or a low resolution height map of the substrate.

12. The alignment measuring apparatus according to claim 11, further comprising:
    a second station, comprising a second alignment sensor system to measure positions of at least one of the multiple alignment marks, wherein the alignment measuring apparatus is arranged to adapt, in the second station, for each measurement of an alignment mark, a height and/or tilt position of the substrate on the basis of the height map provided by the processing unit.

13. A lithographic system, comprising:
    the alignment measuring apparatus of claim 11; and
    a lithographic apparatus comprising a projection system to project successively a patterned radiation beam on multiple target portions of the substrate, wherein the lithographic apparatus is arranged to adapt, in a second station, for each target portion, a height and/or tilt position of the substrate on the basis of the height map provided by the processing unit.

14. A lithographic apparatus, comprising:
    a first station, comprising an alignment sensor system to measure positions of one or more alignment marks at different tilted and/or offset positions of the substrate;
    a processing unit to determine a height of the one or more alignment marks on the basis of the measured positions of the one or more alignment marks, and to determine the height map of the substrate on the basis of the determined height of the one or more alignment marks and a shape model of the substrate; and
    a second station, comprising a projection system to project successively a patterned radiation beam on multiple target portions of the substrate, wherein the lithographic apparatus is arranged to adapt, in the second station, for each target portion, a height and/or tilt position of the substrate on the basis of the height map provided by the processing unit.

* * * * *